(12) United States Patent
Kanosue

(10) Patent No.: US 10,928,441 B2
(45) Date of Patent: Feb. 23, 2021

(54) CIRCUIT DEVICE, TESTER, INSPECTION DEVICE, AND METHOD OF ADJUSTING BENDING OF CIRCUIT BOARD

(71) Applicant: TOKYO ELECTRON LIMITED, Tokyo (JP)

(72) Inventor: Koichi Kanosue, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 50 days.

(21) Appl. No.: 16/507,764

(22) Filed: Jul. 10, 2019

(65) Prior Publication Data

US 2020/0018790 A1 Jan. 16, 2020

(30) Foreign Application Priority Data

Jul. 12, 2018 (JP) .............................. JP2018-132061

(51) Int. Cl.
*G01R 31/28* (2006.01)
*H05K 1/02* (2006.01)
*H05K 7/14* (2006.01)

(52) U.S. Cl.
CPC ....... *G01R 31/2808* (2013.01); *H05K 1/0277* (2013.01); *H05K 7/1427* (2013.01)

(58) Field of Classification Search
CPC ............ G01R 31/2808; G01R 31/2863; G01R 31/2891; G01R 31/2806; H05K 1/0277; H05K 7/1427; G01B 21/20; H01L 22/14

USPC ....................... 324/750.19, 750.16, 537, 500
See application file for complete search history.

(56) References Cited

U.S. PATENT DOCUMENTS

| | | | |
|---|---|---|---|
| 8,264,235 B2 * | 9/2012 | De Vries | H01L 22/34 324/525 |
| 2008/0232181 A1 * | 9/2008 | Higashi | G11C 7/1069 365/201 |
| 2017/0059645 A1 * | 3/2017 | Pan | G11C 29/50008 |

FOREIGN PATENT DOCUMENTS

| | | |
|---|---|---|
| JP | 2015-14556 A | 1/2015 |
| KR | 2001-0109164 A | 12/2001 |

* cited by examiner

*Primary Examiner* — Giovanni Astacio-Oquendo
(74) *Attorney, Agent, or Firm* — Nath, Goldberg & Meyer; Jerald L. Meyer

(57) ABSTRACT

There is provided a circuit device including: a circuit board; a housing configured to support the circuit board; and a bending adjuster configured to adjust bending of the circuit board supported by the housing, wherein the circuit board is supported by the housing by having a portion of the circuit board fixed to the housing, and wherein the bending adjuster includes: a reference member mounted on the housing and spaced apart from a non-fixed portion of the circuit board supported by the housing, the non-fixed portion being a portion that is not fixed to the housing; and a distance adjuster configured to adjust a distance between the non-fixed portion of the circuit board and the reference member such that the circuit board is deformed.

8 Claims, 7 Drawing Sheets

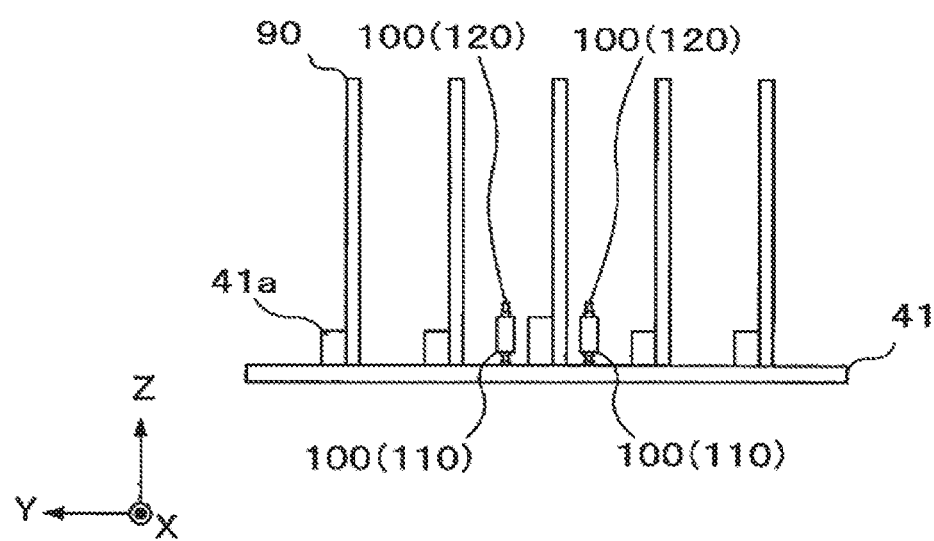

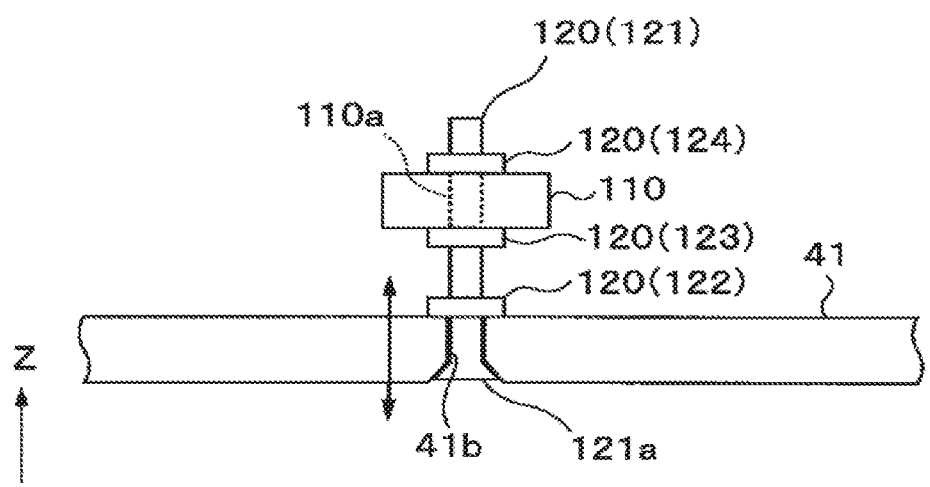

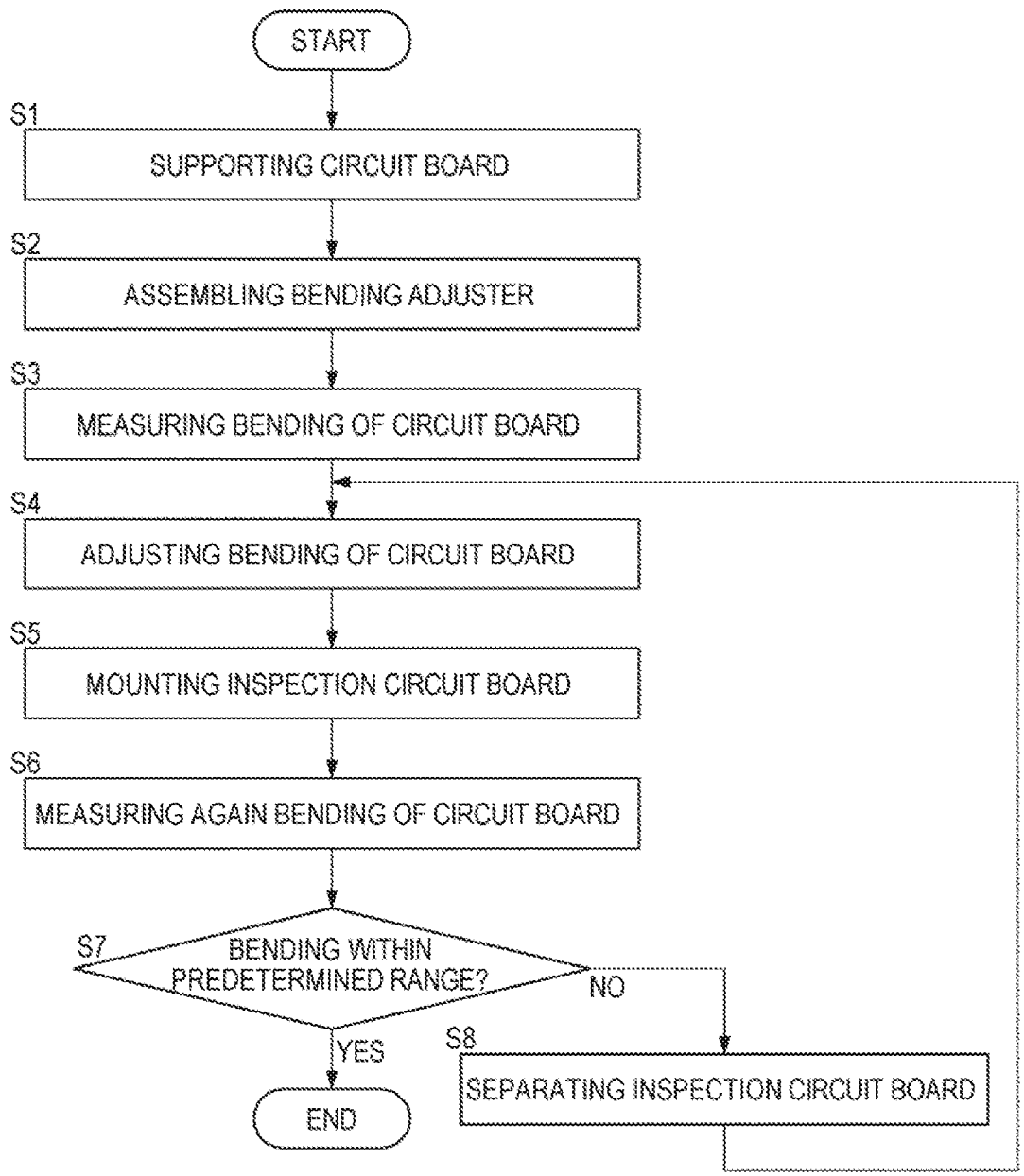

CIRCUIT DEVICE, TESTER, INSPECTION DEVICE, AND METHOD OF ADJUSTING BENDING OF CIRCUIT BOARD

CROSS-REFERENCE TO RELATED APPLICATION

This application is based upon and claims the benefit of priority from Japanese Patent Application No. 2018-132061, filed on Jul. 12, 2018, the entire contents of which are incorporated herein by reference.

TECHNICAL FIELD

The present disclosure relates to a circuit device, a tester, an inspection device, and a method of adjusting bending of a circuit board.

BACKGROUND

An electrical connection device for electrical inspection of ICs (Integrated Circuits) formed on a semiconductor wafer has been disclosed in Patent Document 1. The electrical connection device includes a probe card that is in contact with a semiconductor wafer, a wiring substrate including connection wires, and an electrical connector electrically connecting the probe card and the wiring substrate to each other. The electrical connection device further includes a flat plate-shaped supporting member of which the bottom is a flat mounting reference surface, and the wiring substrate is held on the mounting surface of the supporting member.

Documents of Related Art

Patent Document 1

Japanese Patent Application Publication No. 2015-14556

SUMMARY

The technology of the present disclosure adjusts bending of a circuit board without limiting density of circuit parts that are mounted on the circuit board.

According to one embodiment of the present disclosure, a circuit device includes: a circuit board; a housing configured to support the circuit board; and a bending adjuster configured to adjust bending of the circuit board that is supported by the housing, wherein the circuit board is supported by the housing by having a portion of the circuit board fixed to the housing, and wherein the bending adjuster includes: a reference member mounted on the housing and spaced apart from a non-fixed portion of the circuit board supported by the housing, the non-fixed portion being a portion that is not fixed to the housing; and a distance adjuster configured to adjust a distance between the non-fixed portion of the circuit board and the reference member such that the circuit board is deformed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a side view schematically showing the internal configuration of the tester according to the present embodiment.

FIG. 6 is a side view schematically showing the configuration of a distance adjuster.

FIG. 7 is a flowchart illustrating a process of mounting a circuit board in a tester, including a process of adjusting bending of the circuit board.

DETAILED DESCRIPTION

Figure 1:
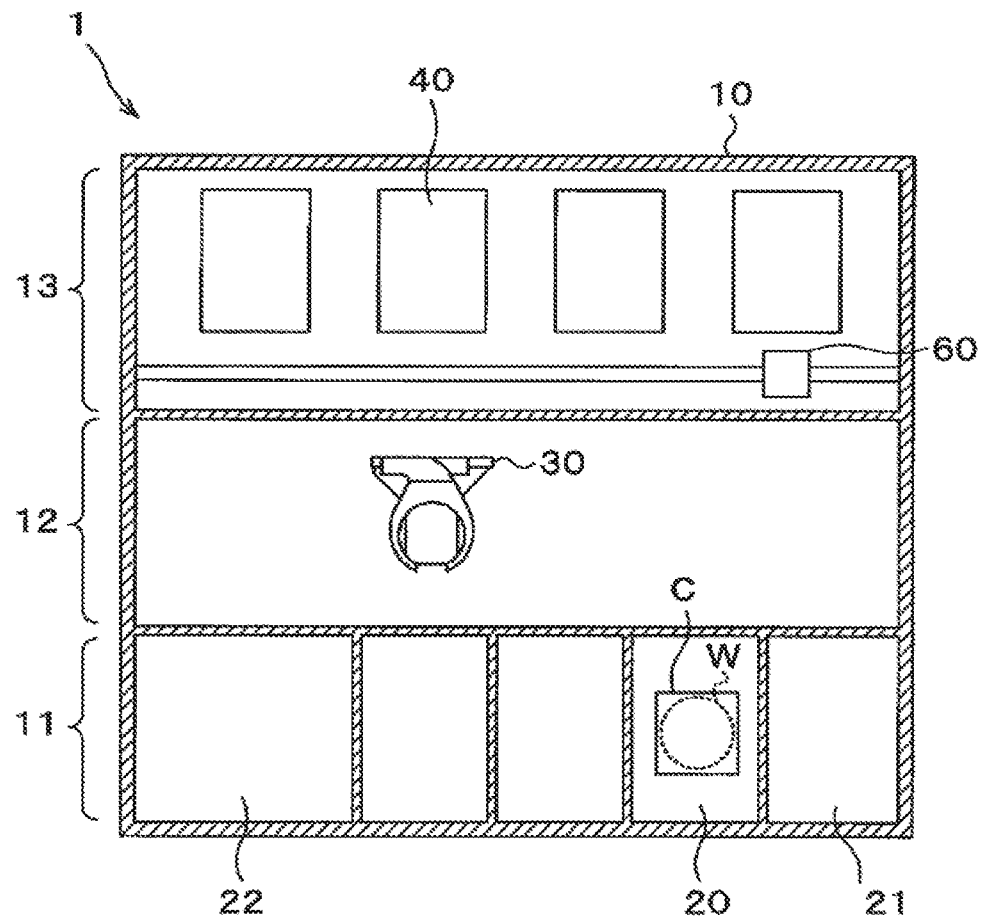
FIG. 1 is a horizontal cross-sectional view schematically showing the configuration of an inspection device including a tester according to the present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a process of manufacturing a semiconductor, electronic devices having a desired circuit pattern is formed on a semiconductor wafer (hereafter, referred to as a 'wafer'). The formed electronic devices are sorted into good products and poor products by inspections of the electrical characteristic etc. An inspection of the electronic devices is made using an inspection device, for example, in the wafer state before the electronic devices are divided.

An inspection device for electronic devices, which is called a prober etc., includes a probe card including probes that are terminals. Further, the inspection device includes an alignment part and a tester. The alignment part aligns and brings the respective probes of the probe card in contact with electrode pads of the electronic devices on a wafer. The tester transmits/receives electrical signals for electrical inspection to/from the electronic devices via the probes. Whether the electronic devices are poor products is determined based on the electrical signals from the electronic devices that the tester detects.

The tester includes a flat plate-shaped circuit board at the lower portion. The probe card is held on the circuit board via a pogo frame, whereby circuit parts mounted on the circuit board and the probes are electrically connected via pogo pins in the pogo frame, so an electrical inspection can be performed on the electronic devices.

However, the circuit board of the tester is bent due to various reasons (e.g., force that is applied to the circuit board when the circuit board is mounted or the weight of the parts mounted on the circuit board), and the circuit board is supported by the tester, so it is not made flat in some cases. If the circuit board is not flat, the probe card that is held on the circuit board is not flat, so poor electrical contact may occur between the probes and the electronic devices.

In Patent Document 1, a flat plate-shaped supporting member of which the bottom is a flat mounting reference surface is installed, and a wiring substrate is mounted on the mounting surface of the supporting member. In Patent Document 1, it may be considered that the wiring substrate is made flat by bringing the entire wiring substrate in close contact with the flat bottom of the flat plate-shaped supporting member such that the wiring substrate follows the flatness of the supporting member.

As Patent Document 1, it is possible to make a circuit board flat by installing the flat plate-shaped supporting member of which the bottom is a flat mounting reference surface on the tester and bringing the entire circuit board in close contact with the flat bottom of the supporting member. However, when the entire circuit board is brought in close contact with the flat bottom of the supporting member, circuit parts cannot be mounted on the close contact portion, so the number of circuit parts that can be mounted on the entire circuit board is remarkably reduced. Even if the close contact portion is not the entire circuit board, but a portion of it, similarly, the number of circuit parts that can be mounted is limited.

Further, the device that is a circuit device including a circuit board without a tester and requires flatness of the circuit board also has the same problem.

Accordingly, the technology of the present disclosure makes it possible to adjust bending of a circuit board without limiting the number of circuit parts that can be mounted on a circuit board. Hereafter, a tester and a method of adjusting bending of a circuit board according to the present embodiment are described with reference to drawings. Further, in the specification and drawings, the components substantially having the same functions are given the same reference numbers and repeated descriptions will be omitted.

First Embodiment

Figure 2:
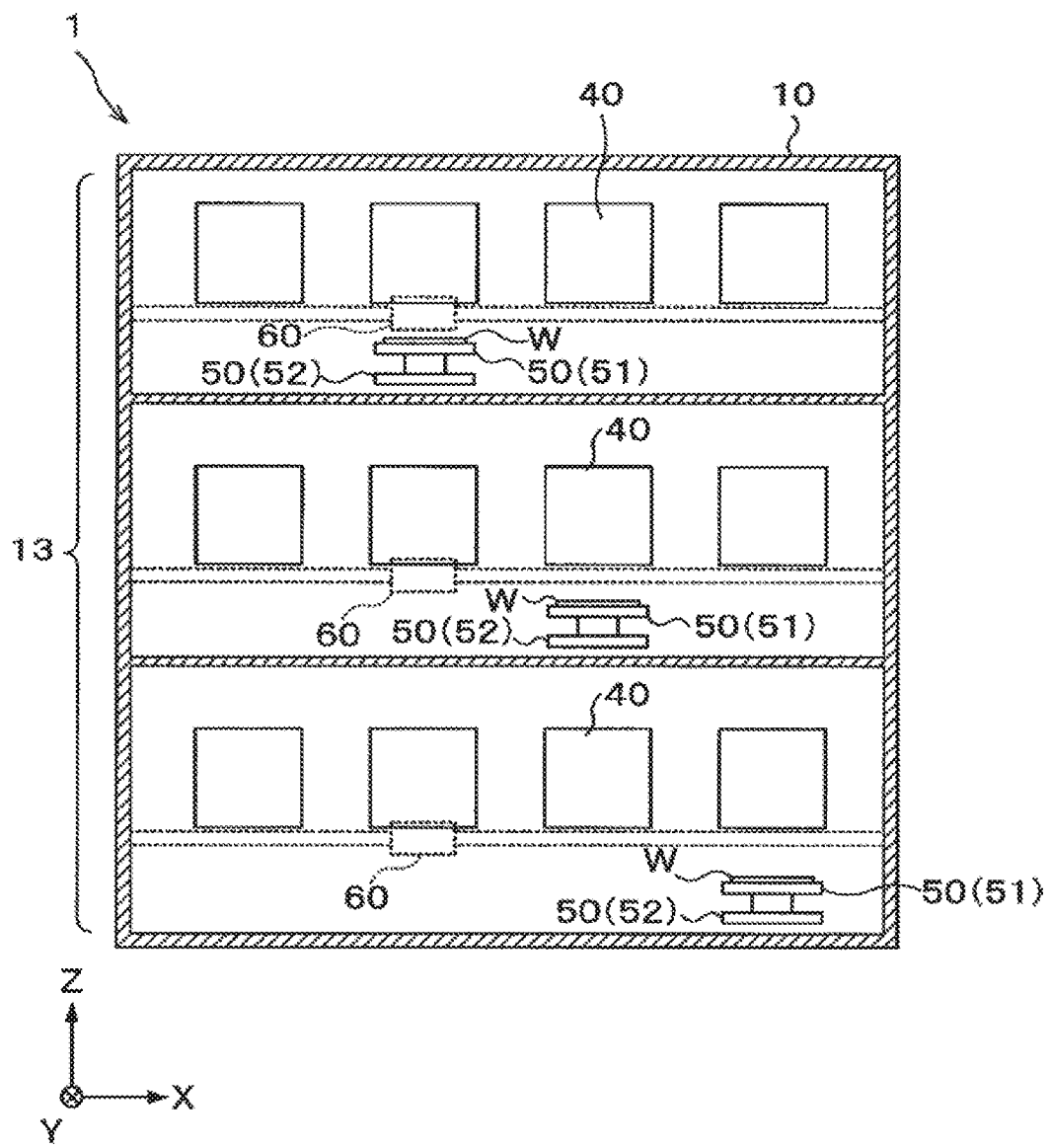
FIG. 2 is a vertical front cross-sectional view schematically showing the configuration of an inspection device including a tester according to the present embodiment.

FIGS. 1 and 2 are respectively a horizontal cross-sectional view and a vertical front cross-sectional view schematically showing the configuration of an inspection device including a tester according to the present embodiment.

As shown in FIGS. 1 and 2, an inspection device 1 has a loading/unloading section 11, a conveying section 12, and an inspection section 13. The loading/unloading section 11 is a section where a wafer W that is an inspection target of the inspection device 1 is loaded and unloaded. The conveying section 12 is a section connecting the loading/unloading section 11 and the inspection section 13. Further, the inspection section 13 is a section where the electrical characteristics of electrical devices formed on the wafer W are inspected.

A port 20 for receiving a cassette C accommodating wafers W, a loader 21 accommodating a probe card to be described below, and a controller 22 controlling components of the inspection device 1 are disposed in the loading/unloading section 11.

A conveyer 30 that can freely move wafers W etc. while holding them is disposed in the conveying section 12. The conveyer 30 conveys wafers W between the cassette C in the port 20 of the loading/unloading section 11 and the inspection section 13. Further, the conveyer 30 conveys a probe card requiring maintenance to the loader 21 of the loading/unloading section 11 from a tester to be described below in the inspection section 13, and conveys a new probe card or a probe card that has completed the maintenance to the tester in the inspection section 13 from the loader 21.

Testers 40 that are inspection parts are disposed in the inspection section 13. In detail, as shown in FIG. 2, three tester rows respectively including four testers 40 arranged horizontally (in the X-direction in the figure) are arranged vertically (in the Z-direction in the figure) in the inspection section 13. One alignment part 50 and one camera 60 are provided for each of the tester rows in the inspection section 13. Further, the number or arrangement of the tester 40, alignment part 50, and camera 60 can be randomly selected.

The tester 40 transmits/receives electrical signals for electrical inspection to/from the wafers W.

The alignment part 50, on which the wafer W is loaded, aligns the loaded wafer W and a tester 40, and is disposed under the tester 40. The alignment part 50 has a chuck top 51 on which a wafer W is loaded and that holds the loaded wafer W. A temperature adjuster (not shown) is embedded in the chuck top 51. Further, the alignment part 50 includes an aligner 52 that supports the chuck top 51 and moves the chuck top 51 up/down (in the Z-direction in the figure), forward/backward (in the Y-direction in the figure), and left/right (in the X-direction in the FIGS.

The camera 60 horizontally moves along a corresponding tester rows, and is positioned in front of the testers 40 of the tester row and photographs the position relationship between the wafer W loaded on the alignment part 50 and the tester 40.

In the inspection device 1, while the conveyer 30 conveys a wafer W to a tester 40, another tester 40 can inspect the electrical characteristic of the electronic devices formed on another wafer W.

The tester 40 is described hereafter.

Figure 3:
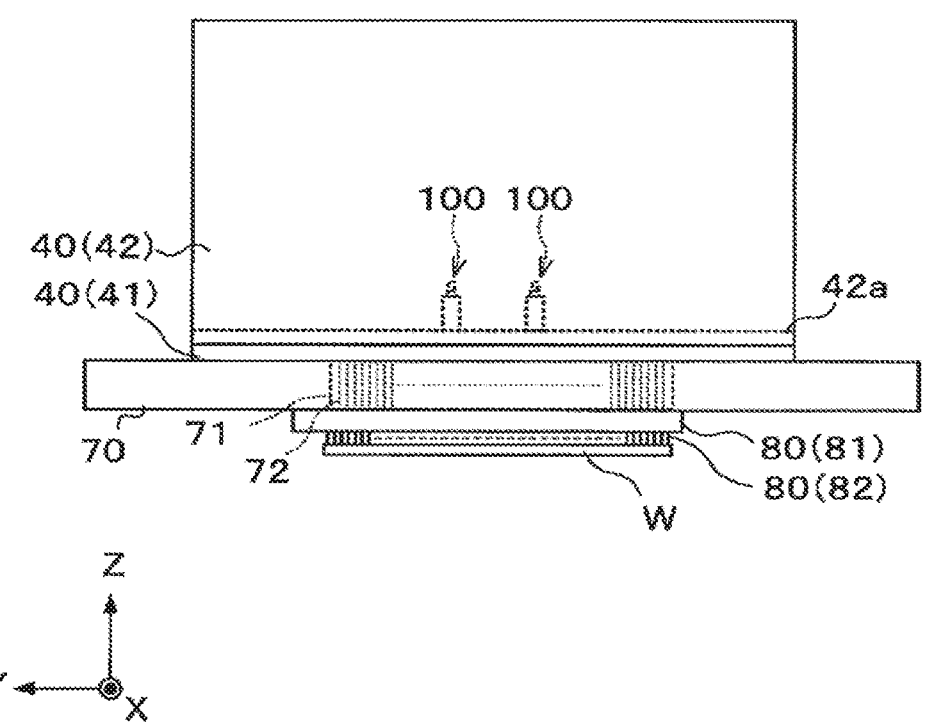
FIG. 3 is a side view schematically showing the configuration of a tester according to the present embodiment.
Figure 4:
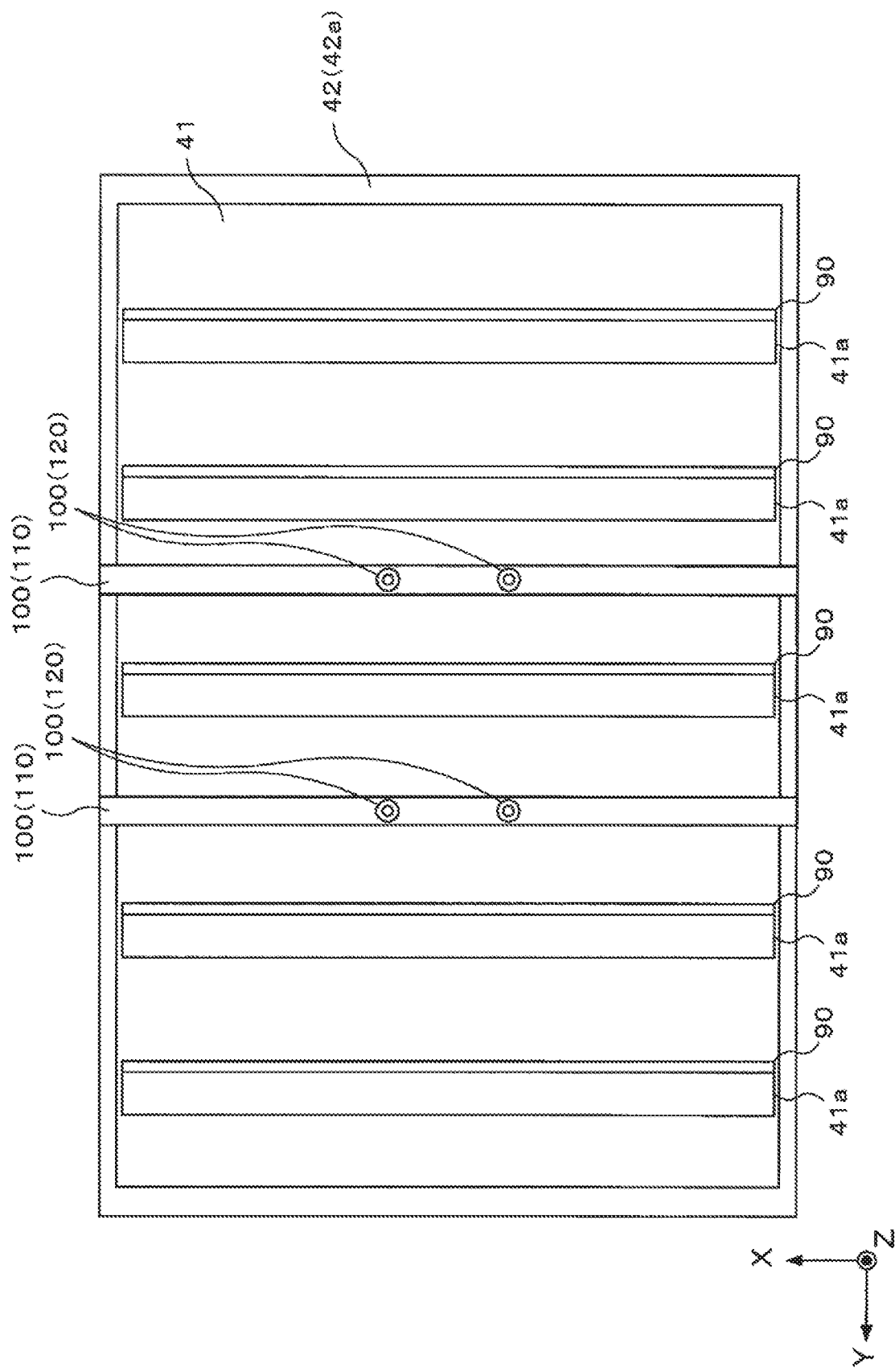
FIG. 4 is a plan view schematically showing the internal configuration of the tester according to the present embodiment.

FIG. 3 is a side view schematically showing the configuration of the tester 40 that is a circuit device, in which a pogo frame 70 or a probe card 80 that will be described below is also shown. FIG. 4 is a plan view showing only a lower frame of a housing 42 to schematically show the internal configuration of the tester 40. FIG. 5 is a side view in which the housing to be described below is omitted to schematically show the internal configuration of the tester 40. FIG. 6 is a side view schematically showing the configuration of a distance adjuster to be described below.

The tester 40, as shown in FIG. 3, includes a flat plate-shaped circuit board 41 at the lower end where circuit parts (not shown) constituting a circuit for electrical inspection are mounted. A circuit part mounted on the circuit board 41, for example, may be a bypass capacitor for removing noise. The probe card 80 is detachably mounted on the bottom of the circuit board 41 via a pogo frame 70 that is a thick plate. The probe card 80 disposed outside the tester 40 is electrically connected to the circuit board 41 via the pogo frame 70.

A pogo block mounting hole 71 is formed at a center of the pogo frame 70, and a pogo block that holds pogo pins 72 is fitted in the pogo block mounting hole 71. The lower ends of the pogo pins 72 are in contact with corresponding electrodes on the top of a card body 81, which will be described below, of the probe card 80 by a vacuum suction force that is applied to the pogo frame 70 and the probe card 80 by a vacuum device (not shown). Further, the upper ends of the pogo pins 72 are pressed against corresponding electrodes of the circuit board 41 by the vacuum suction force.

The probe card 80 includes a disc-shaped card body 81, the electrodes (not shown) disposed on the top of the card body 81, and probes 82 that are needle-shaped terminals extending downward from the bottom of the card body 81. The electrodes disposed on the top of the card body 81 are electrically connected to corresponding probes 82, respectively. Further, when inspecting, the probes 82 come in contact with an electrode pad or a soldered bump of the electronic devices formed on wafers W. Accordingly, in inspection, the electrical signals for the inspection are transmitted/received between the circuit board 41 and the electronic devices on the wafers W via the pogo pins 72, the electrodes provided on the top of the card body 81, and the probes 82.

Next, the tester 40 is further described.

The tester 40 further includes a housing 42 supporting the circuit board 41. The circuit board 41 is supported by the housing 42 with a portion of the circuit board 41 fixed to the housing 42. In detail, the housing 42, as shown in FIGS. 3 and 4, includes a polygonal ring-shaped lower frame 42a forming a lower portion of the housing 42, and an outer circumference of the circuit board 41 is fixed to the bottom of the lower frame 42a, whereby the circuit board 41 is supported by the housing 42. The lower frame 42a is made of a material having high strength such as stainless steel. Further, the housing 42 covers the top of the circuit board 41 to form a space between the housing 42 and the top of the circuit board 41.

The tester 40 includes inspection circuit boards 90 that are other substrates in the space formed by the circuit board 41 and the housing 42, as shown in FIGS. 4 and 5. Connectors 41a are consecutively disposed forward/backward (in the Y-direction in the figure) on the top of the circuit board 41 and the inspection circuit boards 90 are inserted and connected in the connectors 41a, thereby being erected on the circuit board 41.

Further, the tester 40 includes a bending adjuster 100 in the space formed by the circuit board 41 and the housing 42, as shown in FIGS. 3 to 5. The bending adjuster 100 adjusts bending of the circuit board 41 supported by the housing 42 and two bending adjusters are disposed at a center portion forward/backward (in the Y-direction in the figures) of the tester 40, The number and arrangement of the bending adjusters 100 are not limited thereto. Further, each of the bending adjusters 100 includes a reference member (also called a stiffener) 110 and two distance adjusters 120.

The reference member 110 is a member that has a reference for adjusting bending of the circuit board 41 and, for example, includes a plate-shaped member covering only a portion of a center of the circuit board 41. Assuming that a portion not fixed to the housing 42 of the circuit board 41 is a non-fixed portion, the reference member 110 is spaced from the center, which is the non-fixed portion of the circuit board 41 supported by the housing 42, and is mounted on the housing 42. The reference member 110 of the present embodiment extends in the left/right direction (X-direction in the figures) and is fixed to the top of the lower frame 42a with the lower frame 42a between the reference member 110 and the circuit board 41, thereby being mounted on the housing 42 and spaced apart from the center of the circuit board 41. Further, the reference member 110 supports the center of the circuit board 41. In the reference member 110, portions fixed to the top of the lower frame 42a are, for example, both ends in the left/right direction (X-direction in the figures) and are fixed by screws etc. Further, the reference member 110 is made of a material having high strength such as stainless steel. Further, the reference member 110 is disposed at a position not overlapping the connectors 41a or the inspection circuit boards 90, when viewed in a plan view, in order not to interfere with mounting the inspection circuit boards 90 on the circuit board 41.

The distance adjuster 120 adjusts the distance between the reference member 110 and the center that is the non-fixed portion of the circuit board 41 such that the circuit board 41 is deformed. Since the outer circumference that is a portion of the circuit board 41 is fixed to the housing 42, and the reference member 110 mounted in the housing 42 is made of a material having the high strength, thereby adjusting the distance between the non-fixed portion of the circuit board 41 and the reference member 110 deforms the circuit board 41. It is possible to adjust bending of the circuit board by moving the portion, which faces the reference member 110, of the center of the circuit board 41 close to or away from the reference member 110 in accordance with the bending direction of the circuit board 41 using the distance adjuster 120.

The distance adjuster 120 has bolts 121 that is a penetrating member. The bolts 121 penetrate the center of the circuit board 41 and the reference member 110, the lower portion that is a portion of the distance adjuster 120 (the minus side in the Z-direction in the figures) is fixed to the circuit board 41 and the upper portion that is another portion of the distance adjuster 120 (the plus side in the Z-direction in the figures) is fixed to the reference member 110. Further, holes 41b and 110a via which the bolt 121 is inserted are formed at the center that is the non-fixed portion of the circuit board 41 and the reference member 110, respectively. The holes 411) and 110a extend in the up/down direction (Z-direction in the figures). Further, the hole 41b and the hole 110a are formed to be arranged in the up/down direction. The hole 41b of the circuit board 41 is formed in the area where the circuit parts are not mounted.

The distance adjuster 120 can adjust the distance between the center of the circuit board 41 and the reference member 110 by adjusting the position where the bolt 121 is fixed to the reference member 110, specifically, the position where the upper portion of the bolt 121 is fixed to the reference member 110.

The distance adjuster 120 includes a fixing nut 122 and first and second adjusting nuts 123 and 124 that are fastened to the bolt 121.

The fixing nut 122 is for fixing the lower portion of the bolt 121 to the circuit board 41. The lower portion of the bolt 121 and the circuit board 41 are fixed by fitting the circuit board 41 between the fixing nut 122 and a head 121a provided at the lower end of the bolt 121.

The first and second adjusting nuts 123 and 124 are for fixing the upper end of the bolt 121 to the reference member 110 and adjusting the position where the bolt 121 is fixed to the reference member 110.

The first adjusting nut 123 is disposed at a position between the circuit board 41 and the reference member 110 on the bolt 121. The second adjusting nut 124 is disposed at a position where the reference member 110 is interposed between the first adjusting nut 123 and the second adjusting nut 124 on the bolt 121.

The upper portion of the bolt 121 and the reference member 110 are fixed by pressing the first adjusting nut 123 or the second adjusting nut 124 against the reference member 110 or fitting the reference member 110 between the first adjusting nut 123 and the second adjusting nut 124.

Next, an example of an inspection process on a wafer W using the inspection device 1 is described.

First, a wafer W is taken out from the cassette C in the port 20 of the loading/unloading section 11 by the conveyer 30, is inserted into the inspection section 13, and is loaded on the chuck top 51 of the alignment part 50. Next, the probe card 80 and the wafer W on the chuck top 51 are aligned horizontally (in the XY-direction in the figures) by the aligner 52. Next, the chuck top 51 is moved up by the aligner 52, so the probe 82 and the electrode of the electronic device that is an inspection target of the wafer W are in contact with each other.

Further, an electrical signal for the inspection is input to the probes 82 from the tester 40, thereby starting to inspect the electronic device. After one electronic device is finished being inspected, the position of the wafer W is adjusted by the aligner 52, and the electrode of another electronic device and the probe 82 are in contact with each other, whereby the electronic device starts to be inspected.

Thereafter, this process is repeated until all the electronic devices provided on the wafer W finish being inspected. When the inspection of all the electronic devices is finished, the wafer W is returned to the cassette C in the port 20.

Next, a process of mounting the circuit board 41 of the tester 40 that is performed when the inspection device 1 is assembled etc. and that includes a bending adjustment process for the circuit board 41 is described. FIG. 7 is a flowchart illustrating an example of the process of the mounting.

In the process of the mounting the circuit board 41 of the tester 40, first, a portion of the circuit board 41 is fixed to the housing 42, and the circuit board 41 is supported by the housing 42 (step S1).

In detail, the housing 42 is supported by a mounting jig (not shown) of the circuit board 41 installed on a flat floor. Further, the outer circumference of the circuit board 41 and the lower frame 42a are fixed and the circuit board 41 is supported by the housing 42 such that the lower surface of the lower frame 42a of the housing 42 and the top surface of the outer circumference of the circuit board 41 are in close contact with each other. Further, the reference member 110 has already been mounted on the lower frame 42a.

Next, the bending adjuster 100 is assembled (step S2), In detail, the bolt 121 is installed with respect to the circuit board 41 and the reference member 110 such that the circuit board 41, the fixing nut 122, the first adjusting nut 123, the reference member 110, and the second adjusting nut 124 are arranged in this order on the bolt 121.

Next, bending of the circuit board 41 supported by the housing 42 is measured (step S3). In detail, laser displacement meters (not shown) are installed on the floor on which the mounting jig is installed, and the distance from the bottom of the circuit board 41 supported by the housing 42 to the floor is measured by the laser displacement meters. Further, the flatness of the circuit board 41, that is, bending of the circuit board 41 is calculated (measured) based on the distance measured by the laser displacement meters and position information of the laser displacement meters. Further, this process may be performed while moving one laser displacement meter.

Next, bending of the circuit board 41 is adjusted using the bending adjuster 100 based on the result of measuring betiding of the circuit board 41 (step S4). In detail, betiding of the circuit board 41 is adjusted using the bending adjuster 100 based on the result of calculating the flatness of the circuit board 41, an estimated displacement amount of the flatness when the inspection circuit board (daughter board) 90 is mounted on the circuit board (mother board) 41, and target flatness. In more detail, the distance between the center of the circuit board 41 and the reference member 110 is adjusted by all or some of a total of four distance adjusters 120 of two bending adjusters 100 based on the results of calculating the flatness of the circuit board 41 etc.

For example, when the circuit board 41 is bent to be convex downward, the second adjusting nut 124 is fastened while the first adjusting nut 123 of a corresponding distance adjuster 120 is made not in contact with the reference member 110 (in a free state). Accordingly, it is possible to reduce bending of the circuit board 41 and maintain the circuit board 41 in a flat state by moving up the center of the circuit board 41.

Further, when the circuit board 41 is bent to be convex upward, the first adjusting nut 123 is fastened while the second adjusting nut 124 of a corresponding distance adjuster 120 is made in a free state. Accordingly, it is possible to reduce bending of the circuit board 41 and maintain the circuit board 41 in a flat state by moving down the center of the circuit board 41.

Next, the inspection circuit board 90 is inserted into the connector 41a on the circuit board 41, thereby mounting the inspection circuit board 90 (step S5). Further, for example, when the number of the inspection circuit board 90 is small and motions of a worker for the bending adjuster 100 are not interfered with the inspection circuit board 90 on the circuit board 41, the inspection circuit board 90 may be mounted before adjustment of bending.

Next, bending adjustment is finished, and bending of the circuit board 41 on which the inspection circuit board 90 mounted is measured again (step S6). Measuring the bending of the circuit board 41 is performed using the laser displacement meters, for example, similarly to step S3.

Further, when the re-measured bending of the circuit board 41 is within a predetermined rang m the case of "Yes" in step S7), the process of mounting the circuit board 41 of the tester 40 is finished.

On the other hand, when the re-measured bending of the circuit board 41 is not within the predetermined range (in the case of "No" in step S7), the inspection circuit board 90 is separated from the circuit board 41 (step S8) and the processing returns to step S4, and the process described above is repeated. Further, in this case, adjustment of bending of the circuit board in step S4 is performed based on the measurement result in step S6. Further, a case when the process described above is repeated from steps S1 may be considered, but, in this case, the process of assembling the bending adjuster 100 of step S2 is omitted. Further, when it is possible to adjust bending of the circuit board 41 without separating the inspection circuit board 90 from the circuit board 41, step S8 is omitted.

The tester 40 in which bending adjustment and mounting of the circuit board 41 have been finished is embedded in the inspection device 1 after the housing 42 is assembled.

According to the present embodiment, since the bending adjuster 100 is provided, it is possible to correct bending of the circuit board 41 itself or bending when the circuit board 41 is mounted on the housing 42. Further, in the present embodiment, a portion of the circuit board 41 is fixed to the housing 42. Further, in a state that the reference member 110 mounted on the housing 42 is spaced from the center, which is the non-fixed portion of the circuit board 41, bending of the circuit board 41 is adjusted by adjusting the distance from the reference member 110 to the circuit board 41. Accordingly, parts can be mounted on the substantially entire surface of the circuit board 41 including the portion of the circuit board 41 that overlaps the reference member 110 in a plan view, so density of circuit parts that are mounted on the circuit board 41 is not limited.

Further, when the flatness of a circuit board is secured by bringing the circuit board in close contact with a flat plate-shaped member, as the related art, the circuit board may be mounted with flatness secured, and then an inspection circuit board may be mounted on the circuit board. In this case, if the circuit board bends when the inspection circuit board is mounted, it is impossible to correct the bending. However, it is possible to correct even bending that occurs when the inspection circuit board 90 is mounted on the circuit board 41 using the bending adjuster 100 in the present embodiment.

Further, in the present embodiment, it is possible to adjust bending even if the circuit board 41 bends upward or downward, that is, regardless of the bending direction of the circuit board 41 using the bending adjuster 100.

In the examples described above, the distance between the center, which is the non-fixed portion of the circuit board 41, and the reference member 110 is adjusted by adjusting the position where the bolt 121, which is a penetrating member, is fixed to the reference member 110. However, the distance may also be adjusted by adjusting the position where the bolt 121 is fixed to the non-fixed portion of the circuit board 41. Further, the distance may be adjusted by both adjusting the position where the bolt 121, which is a penetrating member, is fixed to the reference member 110 and adjusting the position where the bolt 121 is fixed to the non-fixed portion of the circuit board 41.

The tester 40 was exemplified above, but the technology of the present disclosure may be applied to a device that is a circuit device including a circuit board and requires flatness of the circuit board other than the tester.

The embodiment disclosed herein should be construed as examples, not limiting in all terms. The embodiments described above may be omitted, replaced, and changed in various ways without departing from the accompanying claims and the subject thereof.

Further, the following configuration is also included in the technical range of the present disclosure.

(1) A circuit device including a circuit board, the circuit device including:
a housing configured to support the circuit board; and
a bending adjuster configured to adjust bending of the circuit board that is supported by the housing,
wherein the circuit board is supported by the housing by having a portion of the circuit board fixed to the housing, and
wherein the bending adjuster includes:
a reference member mounted on the housing and spaced apart from a non-fixed portion of the circuit board that is supported by the housing, the non-fixed portion being a portion that is not fixed to the housing; and
a distance adjuster configured to adjust a distance between the non-fixed portion of the circuit board and the reference member such that the circuit board is deformed.

In (1), since the bending adjuster is included, it is possible to adjust bending of the circuit board in accordance with the size or direction of bending of the circuit board. Further, in (1), since the circuit board is supported by the housing by having the portion of the circuit board fixed to the housing and the distance between the reference member spaced apart from the non-fixed portion of the circuit board and mounted on the housing and the non-fixed portion of the circuit board is adjusted, thereby adjusting bending of the circuit board. Accordingly, since circuit parts can be mounted in the portion, which faces the reference member, of the circuit board, density of the circuit parts that are mounted on the circuit board is not limited.

(2) A tester that transmits/receives an electrical signals for an electrical inspection to/from an inspection target, the tester including:
a circuit board for the electrical inspection;
a housing configured to support the circuit board; and
a bending adjuster configured to adjust bending of the circuit board that is supported by the housing,
wherein the circuit board is supported by the housing by having a portion of the circuit board fixed to the housing, and
the bending adjuster includes:
a reference member mounted on the housing and spaced apart from a non-fixed portion of the circuit board that is supported by the housing, the non-fixed portion being a portion that is not fixed to the housing; and
a distance adjuster configured to adjust a distance between the non-fixed portion of the circuit board and the reference member such that the circuit board is deformed.

(3) The tester disclosed in (2), wherein the distance adjuster includes a penetrating member that penetrates the non-fixed portion of the circuit board and the reference member, the penetrating member including a first portion fixed to the non-fixed portion and a second portion fixed to the reference member, and
wherein the distance adjuster adjusts the distance by at least one selected from the group of adjusting a position where the penetrating member is fixed to the reference member and adjusting a position where the penetrating member is fixed to the non-fixed portion.

(4) The tester disclosed in (3), wherein the penetrating member is a bolt,
wherein the tester further includes a first adjusting nut and a second adjusting nut, which are fastened to the bolt, to fix the second portion of the bolt to the reference member,
wherein the first adjusting nut is disposed at a position between the circuit board and the reference member, and
wherein the second adjusting nut is disposed such that the reference member is interposed between the first adjusting nut and the second adjusting nut.

(5) The tester disclosed in any one of (2) to (4), including another circuit board inserted in a connector provided at the circuit board.

(6) The tester disclosed in any one of (2) to (5), wherein a probe card disposed outside the tester is electrically connected to the circuit board.

(7) An inspection device including the tester disclosed in any one of (2) to (6); and an alignment part on which the inspection target is loaded and that aligns the loaded inspection target with the tester.

(8) A method of adjusting bending of a circuit board of a circuit device, the method including:
fixing a portion of the circuit board to a housing of the circuit device such that the housing supports the circuit board; and
adjusting a distance from a reference member mounted on the housing to a non-fixed portion, which is a portion that is not fixed to the housing, of the circuit board supported by the housing such that the reference member is spaced from the non-fixed portion, and adjusting bending of the circuit board.

According to the present disclosure, it is possible to adjust bending of a circuit board without limiting density of circuit parts that are mounted on the circuit board.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A circuit device comprising:
   a circuit board;
   a housing configured to support the circuit board; and
   a bending adjuster configured to adjust bending of the circuit board that is supported by the housing,
   wherein the circuit board has a portion fixed to the housing, thereby being supported by the housing, and
   wherein the bending adjuster includes:
      a reference member mounted on the housing and spaced apart from a non-fixed portion of the circuit board that is supported by the housing, the non-fixed portion being a portion that is not fixed to the housing; and
      a distance adjuster configured to adjust a distance between the non-fixed portion of the circuit board and the reference member such that the circuit board is deformed.

2. A tester that transmits and receives an electrical signal for an electrical inspection to and from an inspection target, the tester comprising:
   a circuit board for the electrical inspection;
   a housing configured to support the circuit board; and
   a bending adjuster configured to adjust bending of the circuit board that is supported by the housing,
   wherein the circuit board has a portion fixed to the housing, thereby being supported by the housing, and
   wherein the bending adjuster includes:
      a reference member mounted on the housing and spaced apart from a non-fixed portion of the circuit board supported by the housing, the non-fixed portion being a portion that is not fixed to the housing; and
      a distance adjuster configured to adjust a distance between the non-fixed portion of the circuit board and the reference member such that the circuit board is deformed.

3. The tester of claim 2, wherein the distance adjuster includes a penetrating member that penetrates the non-fixed portion of the circuit board and the reference member, the penetrating member including a first portion fixed to the non-fixed portion and a second portion fixed to the reference member, and
   wherein the distance adjuster adjusts the distance by at least one selected from the group of adjusting a position where the penetrating member is fixed to the reference member and adjusting a position where the penetrating member is fixed to the non-fixed portion.

4. The tester of claim 3, wherein the penetrating member is a bolt,
   wherein the tester further comprises a first adjusting nut and a second adjusting nut, which are fastened to the bolt, to fix the second portion of the bolt to the reference member,
   wherein the first adjusting nut is disposed at a position between the circuit board and the reference member, and
   wherein the second adjusting nut is disposed such that the reference member is interposed between the first adjusting nut and the second adjusting nut.

5. The tester of claim 2, further comprising another circuit board inserted in a connector provided at the circuit board.

6. The tester of claim 2, wherein a probe card disposed outside the tester is electrically connected to the circuit board.

7. An inspection device comprising:
   the tester of claim 2; and
   an alignment part on which the inspection target is loaded and that aligns the loaded inspection target with the tester.

8. A method of adjusting bending of a circuit board of a circuit device, the method comprising:
   fixing a portion of the circuit board to a housing of the circuit device such that the housing supports the circuit board; and
   adjusting a distance from a reference member mounted on the housing to a non-fixed portion, which is a portion that is not fixed to the housing, of the circuit board that is supported by the housing such that the reference member is spaced from the non-fixed portion, and adjusting bending of the circuit board.

* * * * *